US012581599B2

(12) United States Patent
Lv et al.

(10) Patent No.: US 12,581,599 B2
(45) Date of Patent: Mar. 17, 2026

(54) PACKAGING MODULE, ELECTRONIC DEVICE, AND METHODS FOR MANUFACTURING THE SAME

(71) Applicant: HUAWEI TECHNOLOGIES CO., LTD., Shenzhen (CN)

(72) Inventors: Yatao Lv, Dongguan (CN); Qingguo Tang, Dongguan (CN); Ning Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 206 days.

(21) Appl. No.: 18/173,320

(22) Filed: Feb. 23, 2023

(65) Prior Publication Data

US 2023/0209717 A1 Jun. 29, 2023

Related U.S. Application Data

(63) Continuation of application No. PCT/CN2021/114475, filed on Aug. 25, 2021.

(30) Foreign Application Priority Data

Aug. 25, 2020 (CN) .......................... 202010876458.9

(51) Int. Cl.
*H05K 1/181* (2026.01)
*H05K 3/28* (2006.01)

(52) U.S. Cl.
CPC .............. *H05K 1/181* (2013.01); *H05K 3/28* (2013.01); *H05K 2201/10242* (2013.01)

(58) Field of Classification Search
CPC .... H05K 1/14; H05K 1/141–147; H05K 1/18; H05K 1/181–187; H05K 3/28;
(Continued)

(56) References Cited

U.S. PATENT DOCUMENTS 5,969,952 A * 10/1999 Hayashi ................. H05K 3/368
439/74
6,611,435 B2 * 8/2003 Kumar ................. H05K 1/0262
713/300
(Continued)

FOREIGN PATENT DOCUMENTS

CN 105990266 A 10/2016
CN 108901168 A 11/2018
(Continued)

*Primary Examiner* — Tuan T Dinh
(74) *Attorney, Agent, or Firm* — WOMBLE BOND DICKINSON (US) LLP

(57) ABSTRACT

Embodiments of this application disclose a packaging module and an electronic device. Both a first surface and a second surface of a PCB in the packaging module are covered with a molding layer, a conductive pin is electrically connected to the PCB, the conductive pin is packaged inside the molding layer along a stacking direction of the PCB and the molding layer, and the conductive pin is partially exposed on an outer surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip.

9 Claims, 13 Drawing Sheets

(58) Field of Classification Search
CPC .......... H05K 3/32; H05K 3/284; H01L 23/28;
H01L 23/498; H01L 23/552
USPC ................ 361/770–787, 790–795, 816, 818;
174/520; 257/660
See application file for complete search history.

(56) References Cited

U.S. PATENT DOCUMENTS

| | | | | |
|---|---|---|---|---|
| 6,747,875 | B2* | 6/2004 | Wildrick ............. | H05K 3/3426 |
| | | | | 361/736 |
| 8,659,909 | B2* | 2/2014 | Searls ................. | H05K 1/0262 |
| | | | | 361/783 |
| 11,791,537 | B2* | 10/2023 | Ariumi ................. | H05K 1/181 |
| | | | | 361/783 |
| 2006/0267159 | A1* | 11/2006 | Yamamoto .......... | H01L 23/3121 |
| | | | | 257/E23.125 |
| 2011/0037170 | A1* | 2/2011 | Shinohara ............. | H01L 21/565 |
| | | | | 257/737 |
| 2012/0139089 | A1 | 6/2012 | Huang et al. | |
| 2014/0085843 | A1* | 3/2014 | Otsubo .................. | H05K 1/181 |
| | | | | 29/832 |
| 2014/0185256 | A1* | 7/2014 | Ogawa ................. | H05K 3/4015 |
| | | | | 29/841 |
| 2014/0251670 | A1 | 9/2014 | Sakai et al. | |
| 2015/0223361 | A1 | 8/2015 | Lim et al. | |
| 2016/0021756 | A1 | 1/2016 | Lee et al. | |
| 2018/0332709 | A1* | 11/2018 | Otsubo .................. | H01F 17/04 |
| 2020/0008325 | A1 | 1/2020 | Otsubo | |
| 2020/0203288 | A1* | 6/2020 | Otsubo ................... | H05K 1/02 |

FOREIGN PATENT DOCUMENTS

| | | |
|---|---|---|
| CN | 109003948 A | 12/2018 |
| CN | 111192860 A | 5/2020 |

* cited by examiner

PACKAGING MODULE, ELECTRONIC DEVICE, AND METHODS FOR MANUFACTURING THE SAME

CROSS-REFERENCE TO RELATED APPLICATIONS

This application is a continuation of International Application No. PCT/CN2021/114475, filed on Aug. 25, 2021, which claims priority to Chinese Patent Application No. 202010876458.9, filed on Aug. 25, 2020. The disclosures of the aforementioned applications are hereby incorporated by reference in their entireties.

TECHNICAL FIELD

This application relates to the field of circuit technologies, and in particular, to a packaging module and an electronic device.

BACKGROUND

To meet an increasing demand for high-performance application such as artificial intelligence and big data mining, a working current of a main power chip of an electronic device is continually increased. Currently, some electronic devices have a power supply requirement of hundreds of amperes. Therefore, it is particularly important to reduce a power supply loss of an electronic device.

In some devices, a printed circuit board (PCB) in an existing packaging module is usually packaged by using a molding technology. The packaging module obtained after packaging may reserve a through hole on a packaging side, so that a pin can be connected to the PCB in the packaging module after the pin is inserted into the through hole. In this way, the packaging module can output an electrical signal by using the pin on a side of the packaging module. In this case, the packaging module can implement electrical interaction with another element on a system board by using the output electrical signal, to implement normal device operation.

The existing packaging module usually uses a manner of pin-out from the side of the packaging module, and may reserve the through hole on the packaging side. In this case, electrical signal wires arranged around the packaging module are cut off by the through hole. Because a chip has a high wiring requirement, the packaging module may be arranged at a position that is far away from the chip, and there are lengthy wires between the packaging module and the chip. The lengthy wires result in an increase in size of an electronic device and increases a power distribution loss of the electronic device.

SUMMARY

Embodiments of this application provide a packaging module and an electronic device. When a packaging module performs electrical interaction with another element, a PCB in the packaging module outputs or inputs an electrical signal by using a conductive pin. In this way, there is no need to reserve a through hole on a packaging side of the packaging module, the packaging module may be arranged at a position close to a chip, and there are short wires between the packaging module and the chip. This reduces a power distribution loss of an electronic device.

A first aspect of this application provides a packaging module. The packaging module includes a molding layer, a conductive pin, and a printed circuit board PCB. Both a first surface and a second surface of the PCB are covered with the molding layer. The conductive pin is electrically connected to the PCB, the conductive pin is packaged inside the molding layer along a stacking direction of the PCB and the molding layer, and the conductive pin is partially exposed on an outer surface of the molding layer.

According to the packaging module provided in this embodiment of this application, both the first surface and the second surface of the PCB in the packaging module are covered with the molding layer, the conductive pin is electrically connected to the PCB, the conductive pin is packaged inside the molding layer along the stacking direction of the PCB and the molding layer, and the conductive pin is partially exposed on the outer surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

In a possible embodiment of the first aspect, in the packaging module, the molding layer includes a first molding layer and a second molding layer, and the conductive pin includes a first conductive pin; the first surface of the PCB is covered with the first molding layer, and the second surface of the PCB is covered with the second molding layer; and a first end of the first conductive pin is electrically connected to the first surface of the PCB, the first conductive pin is packaged inside the first molding layer along a stacking direction of the first surface of the PCB and the first molding layer, and a second end of the first conductive pin is partially exposed on an outer surface of the first molding layer.

In this possible embodiment, the packaging module may include one or more first conductive pins. The packaging module may perform electrical interaction with another element by using the one or more first conductive pins. This possible embodiment improves convenience of connecting the packaging module to a system board.

In a possible embodiment of the first aspect, in the packaging module, the conductive pin further includes a second conductive pin; and a first end of the second conductive pin is electrically connected to the second surface of the PCB, the second conductive pin is packaged inside the second molding layer along a stacking direction of the second surface of the PCB and the second molding layer, and a second end of the second conductive pin is partially exposed on an outer surface of the second molding layer.

In this possible embodiment, the conductive pin includes the second conductive pin, the first ends of the second conductive pin and the first conductive pin are connected to different surfaces of the PCB, and the packaging module may implement electrical interaction with another circuit element by using the first conductive pin and the second conductive pin. The second conductive pin is exposed on the outer surface of the second molding layer. In this way, the outer surface of the second molding layer may be surface-mounted to another circuit element by using the second conductive pin, thereby further making better use of space inside the electronic device.

In a possible embodiment of the first aspect, in the packaging module, the outer surface of the molding layer is a surface that is of the molding layer and that is away from the PCB, the outer surface of the molding layer is a side surface of the molding layer, or the outer surface of the molding layer is a surface that is of the molding layer and that is away from the PCB and a side surface of the molding layer.

In this possible embodiment, in a process of welding the packaging module to the system board, if the outer surface of the molding layer is the surface that is of the molding layer and that is away from the PCB, the packaging module may be surface-mounted to the system board through soldering or the like by using the conductive pin exposed on the surface that is of the molding layer and that is away from the PCB. In this way, assembly difficulty of the packaging module can be reduced, and the packaging module can implement heat dissipation through board mounting, thereby improving heat dissipation efficiency. If the outer surface of the molding layer is the side surface of the molding layer, the packaging module may be assembled on the system board through soldering or the like by using the conductive pin exposed on the surface that is of the molding layer and that is away from the PCB. This provides a new assembly manner. If the outer surface of the molding layer is the surface that is of the molding layer and that is away from the PCB and the side surface of the molding layer, the conductive pin exposed on the surface that is of the molding layer and that is away from the PCB and the side surface of the molding layer is assembled with the PCB through soldering or the like, and the conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

In a possible embodiment of the first aspect, in the packaging module, the conductive pin is surface-mounted to the PCB by using a surface mounting technology (SMT), or the conductive pin is inserted into the PCB.

In a possible embodiment of the first aspect, in the packaging module, the packaging module is a system in package SIP power supply.

In a possible embodiment of the first aspect, in the packaging module, the conductive pin is made of metal, and the metal includes copper, silver, or gold.

In this possible embodiment, the conductive pin is made of metal such as copper, silver, or gold, so that the conductive pin has better electrical conductivity, thereby reducing a power distribution loss of the electronic device.

In a possible embodiment of the first aspect, in the packaging module, the conductive pin is L-shaped.

In this possible embodiment, the conductive pin is made into an L shape, so that a processing process for the conductive pin is simpler, thereby reducing processing costs of the conductive pin.

In a possible embodiment of the first aspect, in the packaging module, the molding layer is made of epoxy resin.

A second aspect of this application provides an electronic device. The electronic device includes a packaging module, a system board, and a function module. The packaging module includes a molding layer, a conductive pin, and a printed circuit board PCB. The packaging module supplies power to the function module. The packaging module and the function module are surface-mounted to or inserted into the system board. The packaging module is the packaging module described in any one of the first aspect or the possible embodiments of the first aspect.

A third aspect of this application provides a method for manufacturing a packaging module. The manufacturing method includes: mounting a circuit element and a conductive pin on at least one of a first surface and a second surface of a printed circuit board PCB, where the conductive pin is electrically connected to the PCB; performing molding on the PCB, the circuit element, and the conductive pin, where the conductive pin is packaged inside a molding layer along a stacking direction of the PCB and the molding layer; grinding a surface that is of the molding layer and that is away from the PCB, where the conductive pin in the ground molding layer is partially exposed on the surface that is of the molding layer and that is away from the PCB; and cutting the ground molding layer to obtain the packaging module, where the conductive pin in the packaging module is partially exposed on a side surface of the molding layer.

The method for manufacturing a packaging module provided in this embodiment of this application includes: mounting the circuit element and the conductive pin on at least one of the first surface and the second surface of the printed circuit board PCB, where the conductive pin is electrically connected to the PCB; performing molding on the PCB, the circuit element, and the conductive pin, where the conductive pin is packaged inside the molding layer along the stacking direction of the PCB and the molding layer; grinding the surface that is of the molding layer and that is away from the PCB, where the conductive pin in the ground molding layer is partially exposed on the surface that is of the molding layer and that is away from the PCB; and cutting the ground molding layer to obtain the packaging module, where the conductive pin in the packaging module is partially exposed on the side surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

In a possible embodiment of the third aspect, a same operation process is used for preparing the circuit element on the first surface and/or the second surface of the PCB and preparing the conductive pin on the first surface and/or the second surface of the PCB.

In this possible embodiment, the circuit element and the conductive pin are surface-mounted to the PCB by using the same process. Compared with an existing process for manufacturing a packaging module, there is no need to mount a pin on a side surface of a plastic package body after molding is performed on a circuit element, thereby simplifying an assembly process and reducing production costs of the packaging module.

In a possible embodiment of the third aspect, the conductive pin is a U-shaped conductive pin, a first end and a second end of the U-shaped conductive pin are surface-mounted to or inserted into the PCB, and a beam of the U-shaped conductive pin is away from the PCB; the grinding a surface that is of the molding layer obtained after molding and that is away from the PCB includes: grinding the surface that is of the molding layer obtained after molding and that is away from the PCB to a grinding line, where the grinding line is tangent to the beam of the U-shaped conductive pin, and after grinding, the beam of the U-shaped conductive pin is exposed on the surface that is of the molding layer and that is away from the PCB; and the cutting the ground component includes: cutting the ground component along a cutting line, where the first end of the U-shaped conductive pin and the second end of the U-shaped conductive pin are respectively located on two sides of the cutting line, and after cutting, a cross section that is formed after cutting and that is at the beam of the U-shaped conductive pin is exposed on the side surface of the molding layer.

In this possible embodiment, the surface-mountable U-shaped conductive pin is provided, and the first end of the U-shaped conductive pin and the second end of the U-shaped conductive pin are respectively located on the two sides of the cutting line. During surface mounting, the U-shaped conductive pin is surface-mounted to the PCB through surface mounting of the two ends of the U-shaped conductive pin, and the U-shaped conductive pin is more stable when being surface-mounted, thereby reducing assembling difficulty of the conductive pin. After grinding, the beam of the U-shaped conductive pin is exposed on the surface that is of the molding layer and that is away from the PCB. After cutting, the cross section that is formed after cutting and that is at the beam of the U-shaped conductive pin is exposed on the side surface of the molding layer. The conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

It can be learned from the foregoing technical solutions that embodiments of this application have the following advantages:

According to the packaging module provided in embodiments of this application, both the first surface and the second surface of the PCB in the packaging module are covered with the molding layer, the conductive pin is electrically connected to the PCB, the conductive pin is packaged inside the molding layer along the stacking direction of the PCB and the molding layer, and the conductive pin is partially exposed on the outer surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

6

Figure 4:
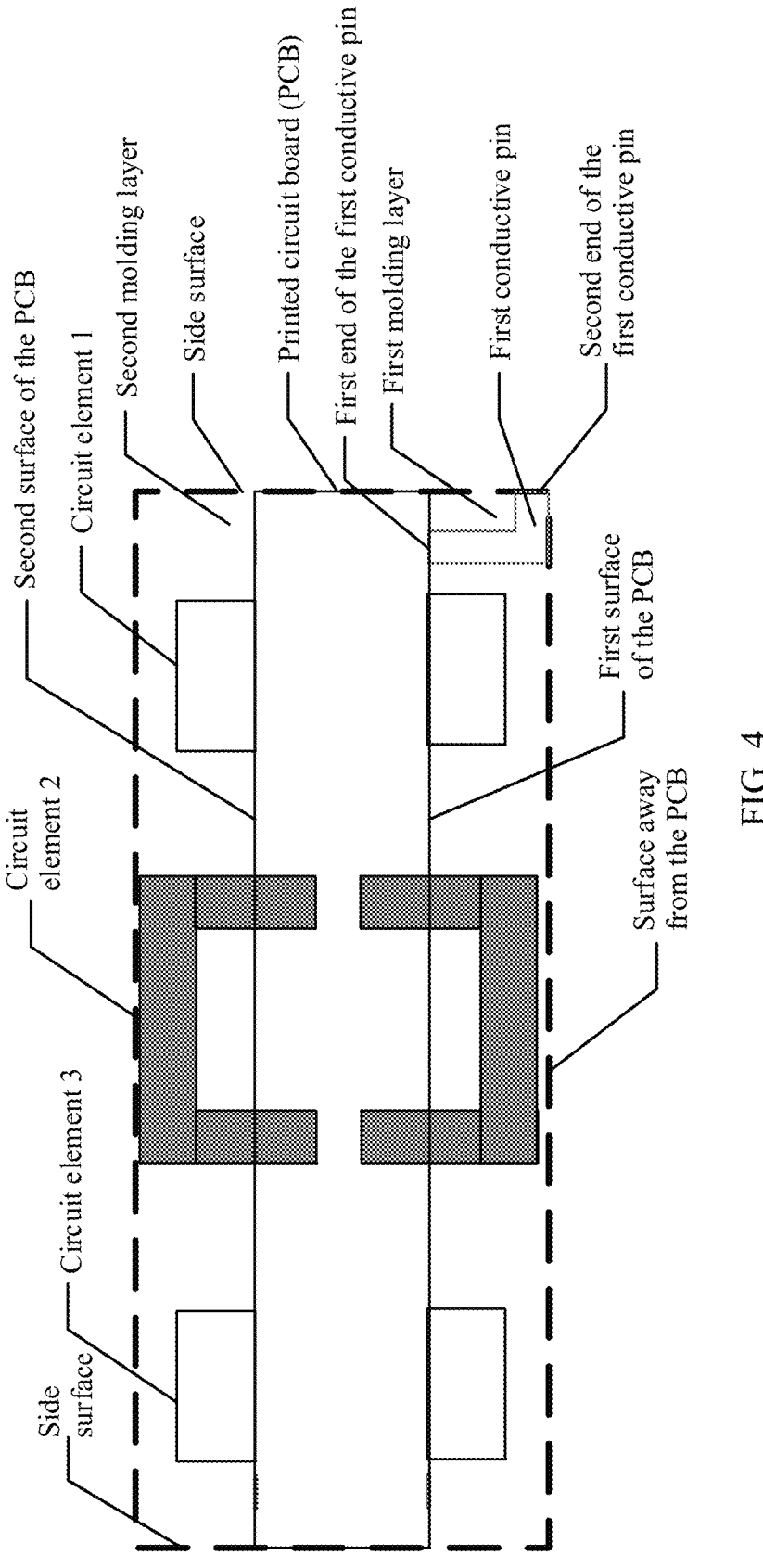
Figure 5:
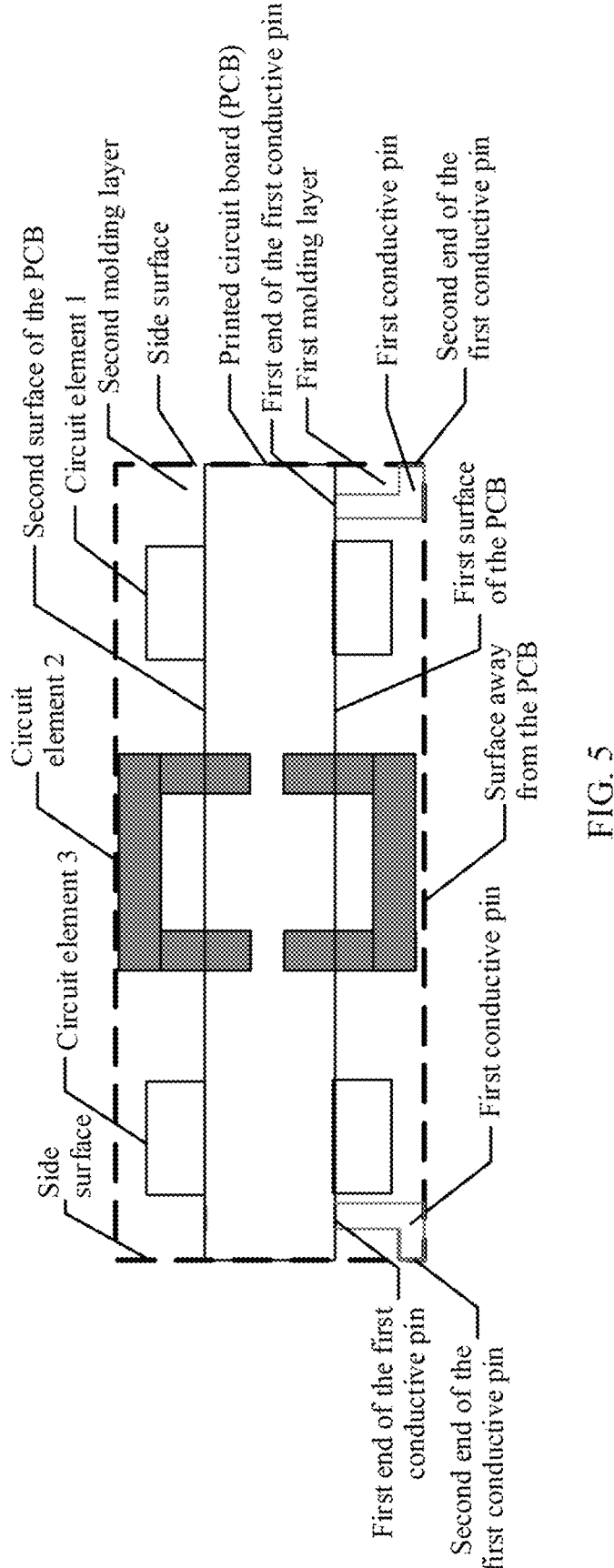
Figure 6:
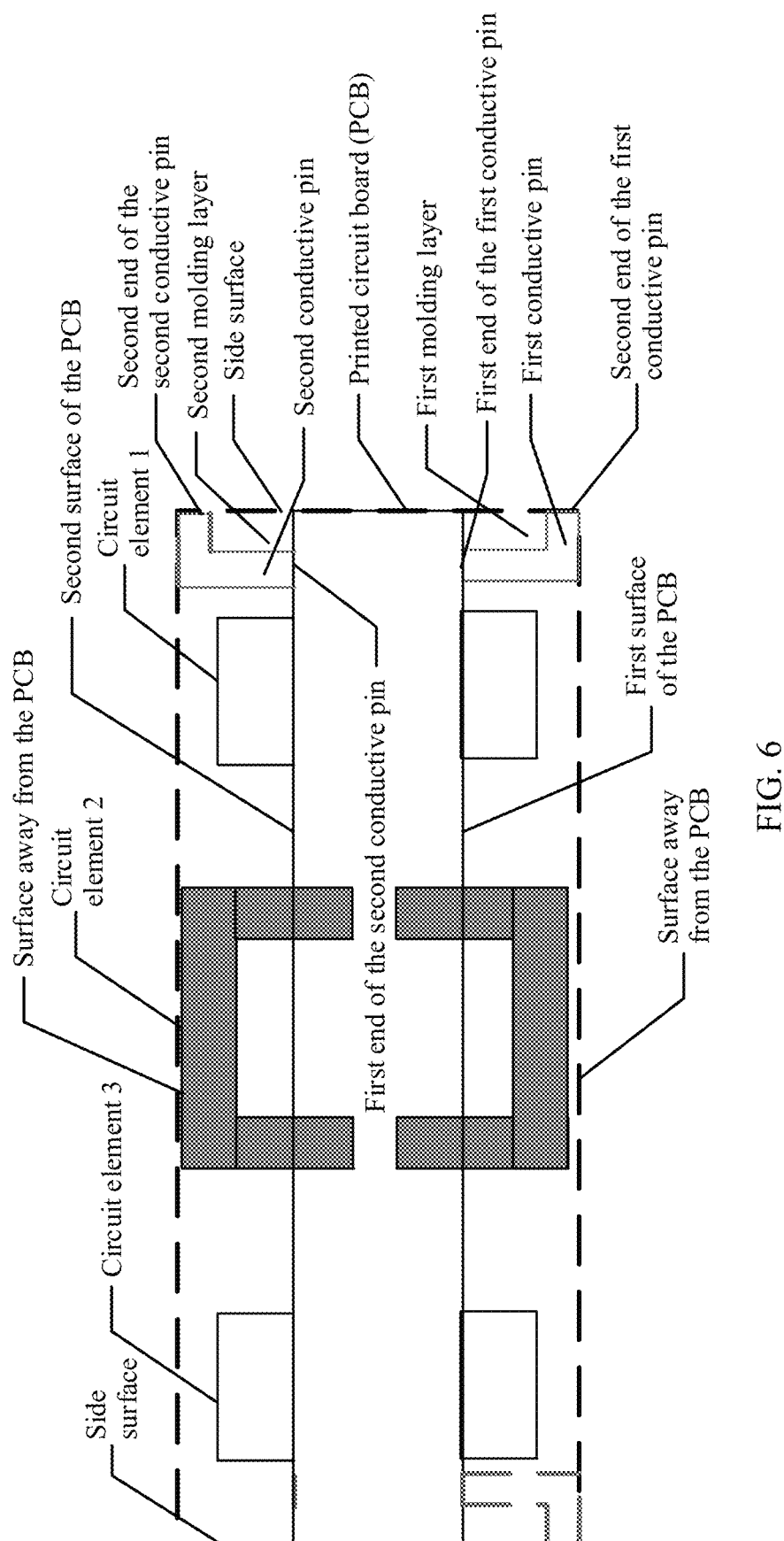
Figure 7A:
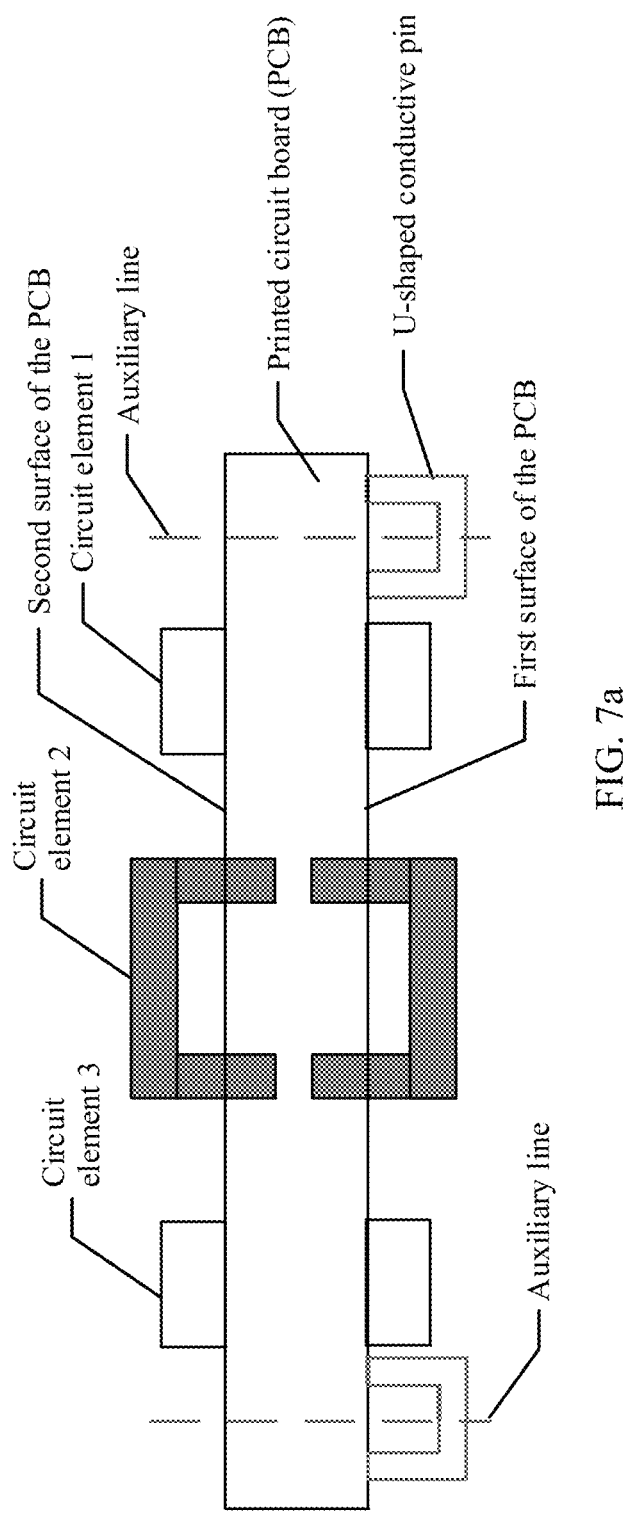
Figure 7B:
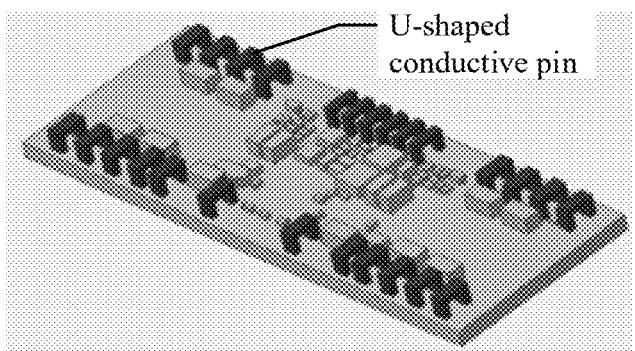
Figure 8:
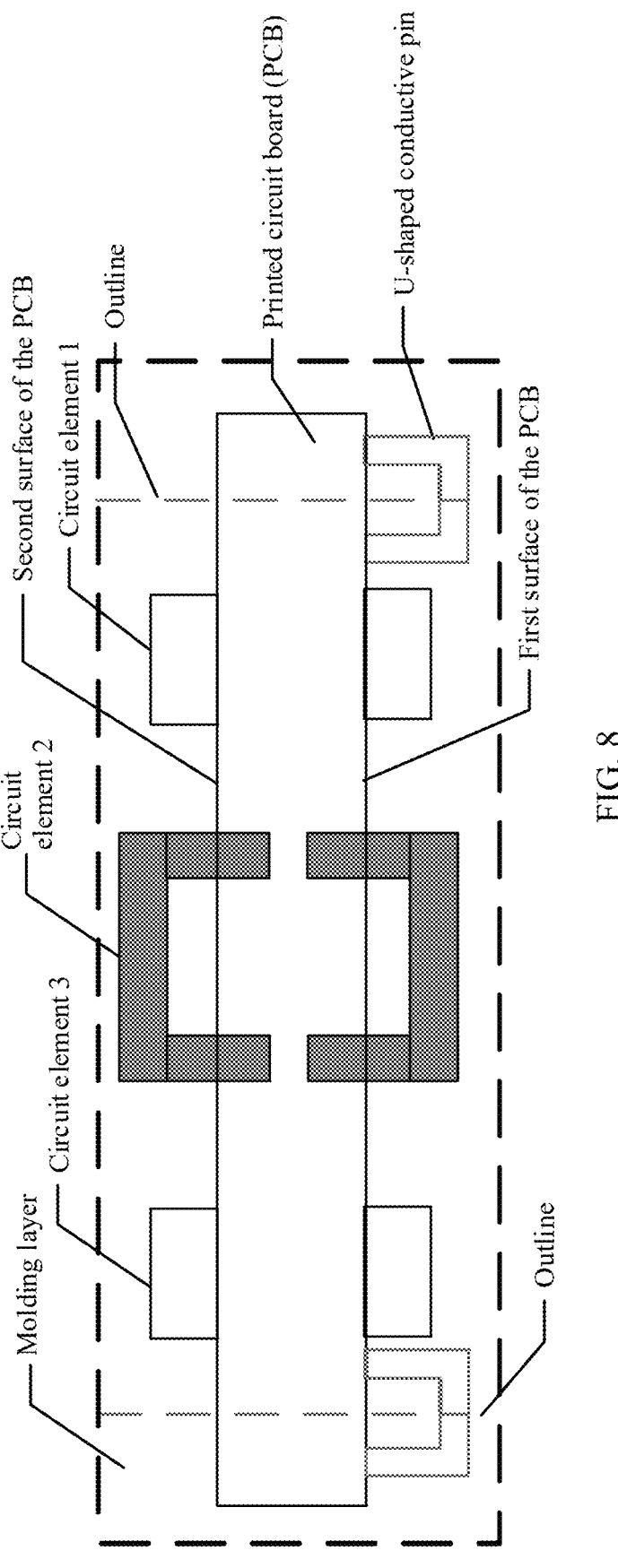
Figure 9:
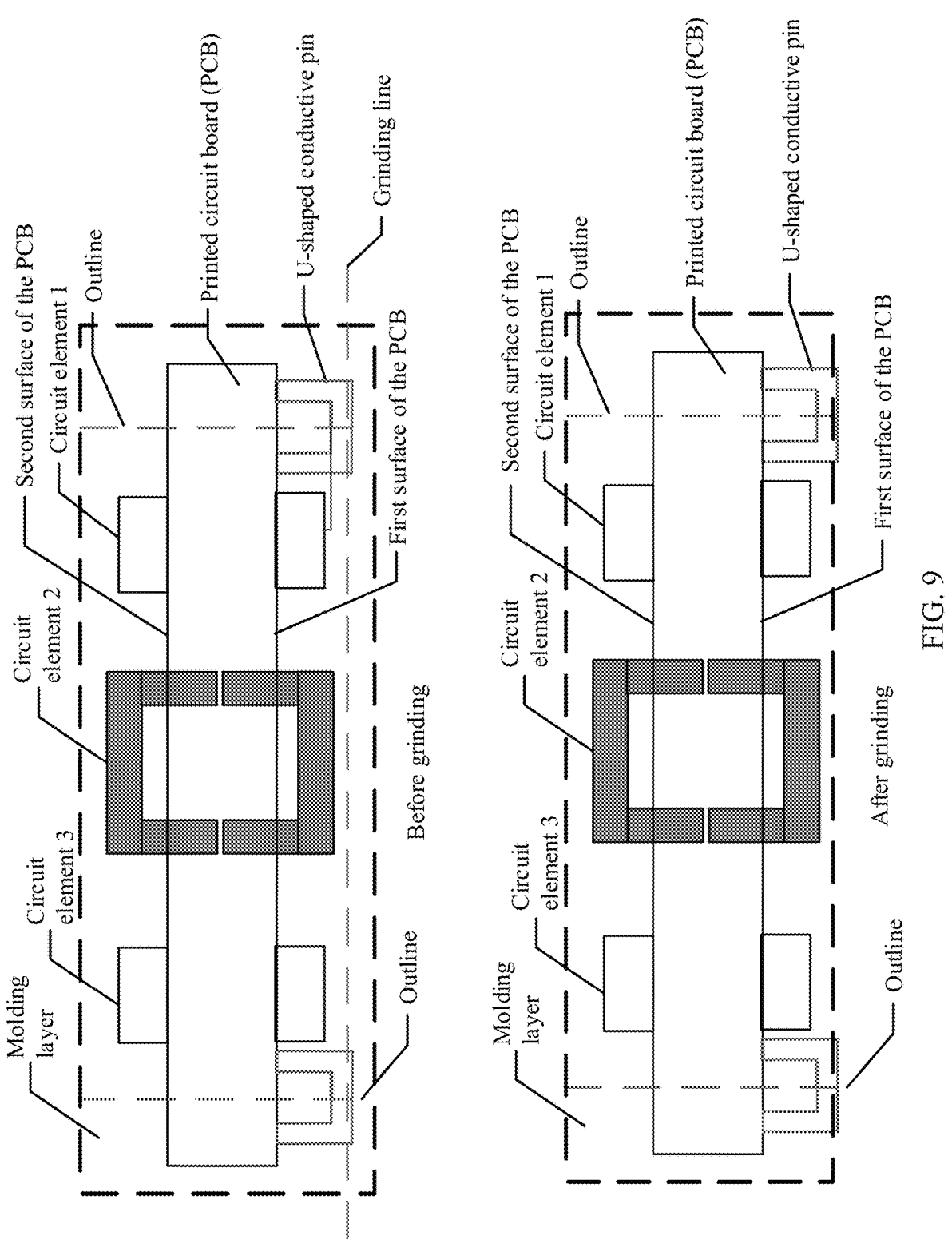
Figure 10A:
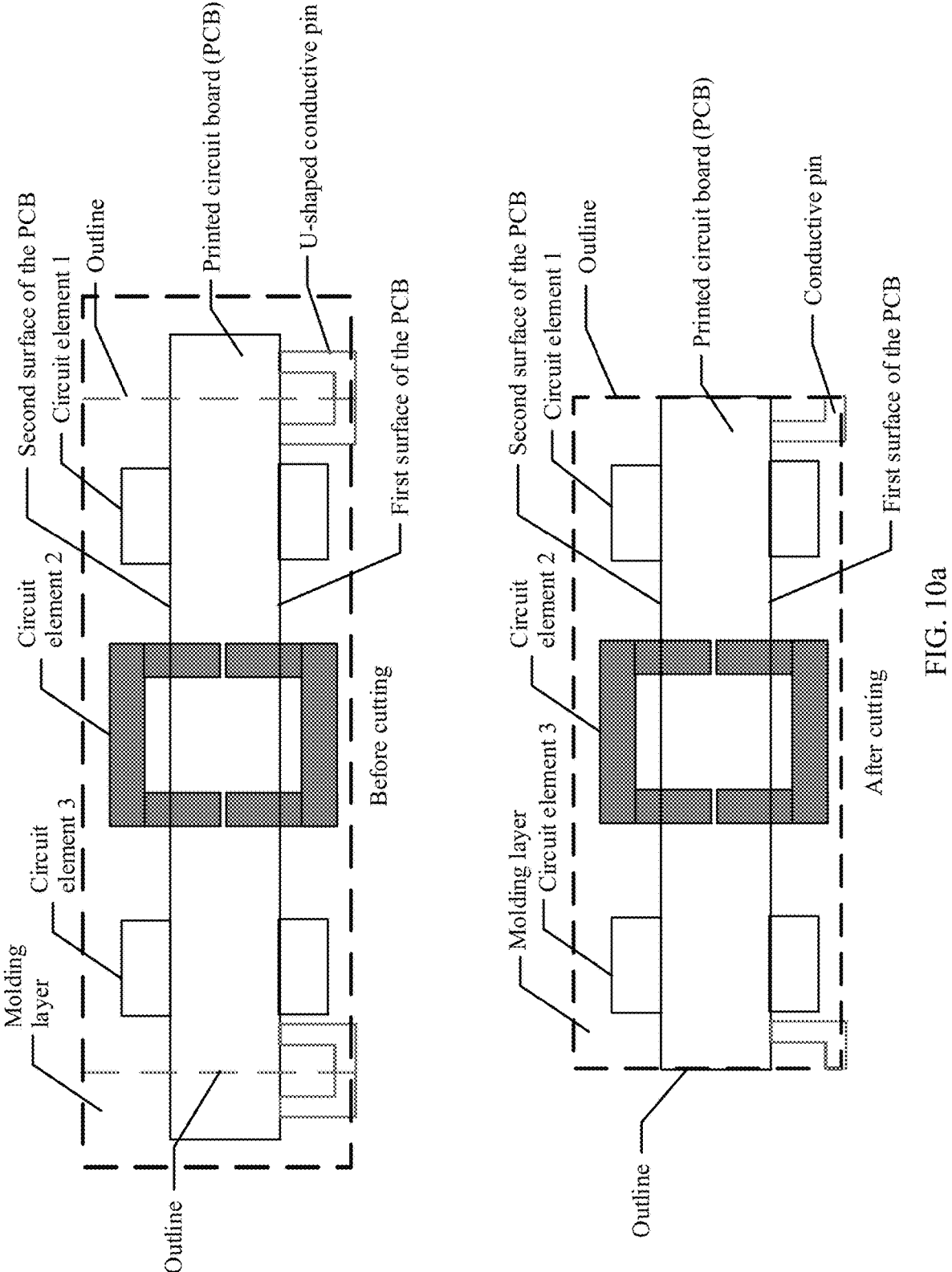
Figure 10B:
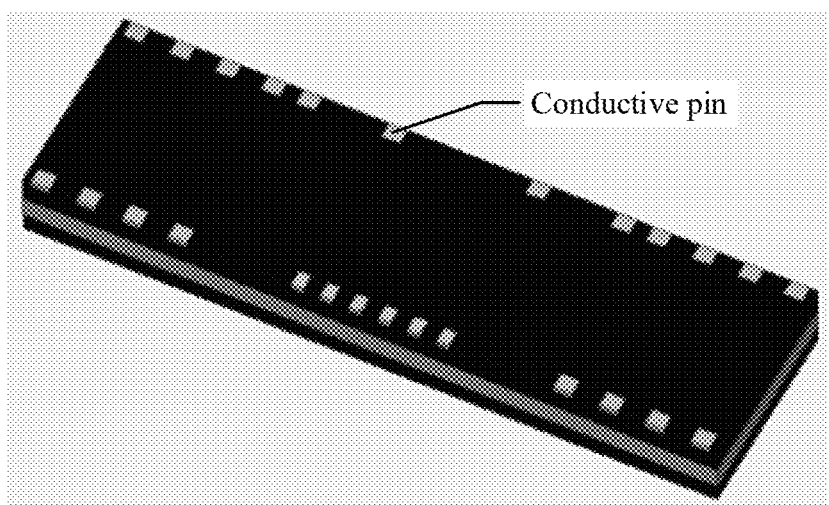

FIG. 4 is a schematic diagram of another structure of a packaging module according to an embodiment of this application;

FIG. 5 is a schematic diagram of another structure of a packaging module according to an embodiment of this application;

FIG. 6 is a schematic diagram of another structure of a packaging module according to an embodiment of this application;

FIG. 7a is a schematic diagram of an embodiment of a method for manufacturing a packaging module according to an embodiment of this application;

FIG. 7b is a schematic diagram of another embodiment of a method for manufacturing a packaging module according to an embodiment of this application;

FIG. 8 is a schematic diagram of another embodiment of a method for manufacturing a packaging module according to an embodiment of this application;

FIG. 9 is a schematic diagram of another embodiment of a method for manufacturing a packaging module according to an embodiment of this application;

FIG. 10a is a schematic diagram of another embodiment of a method for manufacturing a packaging module according to an embodiment of this application; and FIG. 10b is a schematic diagram of another embodiment of a method for manufacturing a packaging module according to an embodiment of this application.

DESCRIPTION OF EMBODIMENTS

To make objectives, technical solutions, and advantages of this application clearer, the following describes embodiments of this application with reference to accompanying drawings. It is clear that, the described embodiments are merely some but not all of embodiments of this application. A person of ordinary skill in the art may learn that, as a new application scenario emerges, the technical solutions provided in embodiments of this application are also applicable to a similar technical problem.

In the specification, claims, and accompanying drawings of this application, terms such as "first" and "second" are intended to distinguish between similar objects but do not necessarily indicate a specific order or sequence. It should be understood that data used in such a way is interchangeable in appropriate circumstances, so that embodiments described herein can be implemented in an order other than the order illustrated or described herein. Moreover, terms "include", "comprise", and any other variants thereof mean to cover non-exclusive inclusion. For example, a process, method, system, product, or device that includes a list of operations or units is not necessarily limited to those operations or units, but may include other operations or units not expressly listed or inherent to such a process, method, product, or device.

The following clearly and completely describes the technical solutions in this application with reference to the accompanying drawings in this application. It is clear that the described embodiments are merely some but not all of embodiments of this application. The following several example embodiments may be combined with each other. Same or similar content is not described again in different embodiments. It should also be noted that, lengths, widths, and heights (or thicknesses) of various components shown in embodiments of this application are merely used as examples for description, and are not intended to limit a structure of a packaging module in this application.

To meet an increasing demand for high-performance application such as artificial intelligence and big data mining, a working current of a main power chip of an electronic device is continually increased. Currently, some electronic devices have a power supply requirement of hundreds of amperes. Therefore, it is particularly important to reduce a power supply loss of an electronic device. For example, how to reduce a power supply loss by designing a position arrangement between a packaging module and a chip is an issue worthy of deep consideration.

Figure 1A:
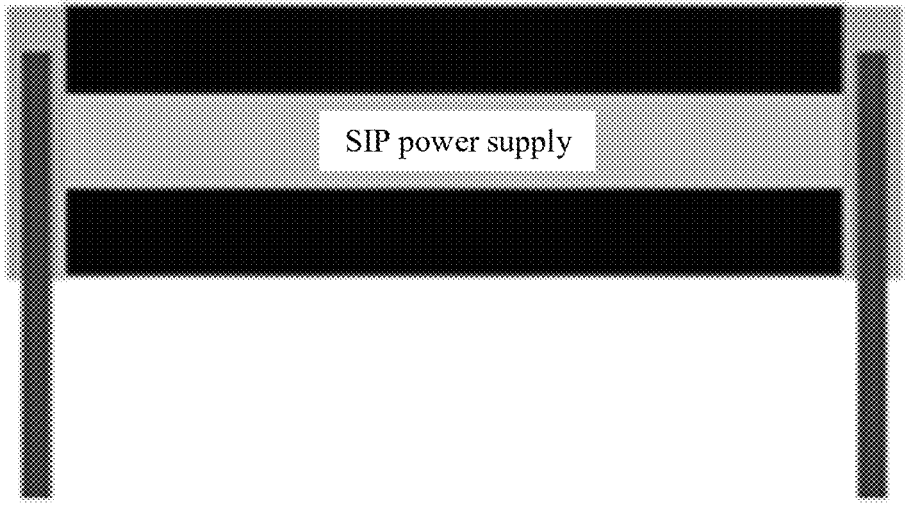
FIG. 1a is a schematic diagram of a pin-out manner used for an existing packaging module.

FIG. 1a is a schematic diagram of a pin-out manner used for an existing packaging module.

As shown in FIG. 1a, the packaging module in an electronic device usually supplies power to a plurality of components such as a chip. In some existing packaging modules, a dual-sided packaging (Molding) form is usually used. For example, molding is performed on both an upper surface and a lower surface of a PCB in some system in package (SIP) packaging modules. A pin-out manner used for an SIP packaging module in a double-sided packaging form is different from that used for an SIP packaging module in a single-sided packaging form. The SIP packaging module in a single-sided packaging form usually uses a frame or a carrier plate to implement pin-out from a bottom part of the SIP packaging module to output an electrical signal. As shown in FIG. 1a, due to a limitation on mold design, the SIP packaging module in a double-sided packaging form cannot use a manner that is used by the SIP packaging module in a single-sided packaging form for pin-out from a bottom part of the SIP packaging module to output an electrical signal. The SIP packaging module in a double-sided packaging form may reserve a through hole on a packaging side, so that a pin can be connected to a PCB after being inserted into the through hole. In this way, the packaging module can output an electrical signal by using the pin on a side of the packaging module. The output electrical signal may be used to supply power to another component in the electronic device, to maintain normal device operation.

Figure 1B:
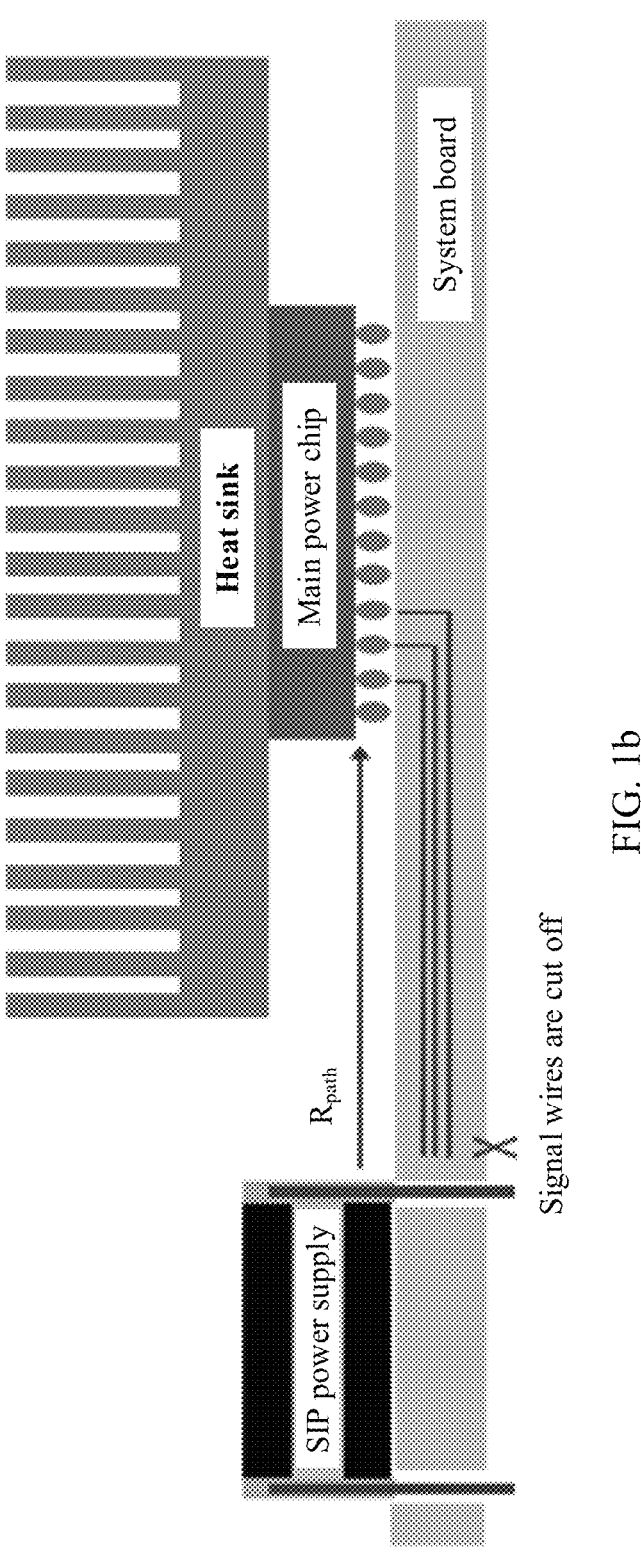
FIG. 1b is a schematic diagram of application of an existing packaging module.

FIG. 1b is a schematic diagram of application of an existing packaging module.

As shown in FIG. 1b, because pin-out from a side surface of the existing packaging module is to be implemented in the existing packaging module, the existing packaging module may reserve a through hole on a packaging side of the existing packaging module, so that after the pin is inserted into the through hole, the packaging module performs electrical interaction with the outside through the through hole. However, electrical signal wires arranged around the packaging module are cut off by the through hole reserved on the side. Because a chip has a high wiring requirement, to prevent wires of the chip from being cut off by the through hole reserved on a side wall of the packaging module, a distance between the packaging module and the chip may be increased to meet the wiring requirement of the chip. In this case, the packaging module may be arranged at a position that is far away from the chip. A longer wire leads to a higher copper loss on the wire. Because a copper loss Rpath on a wire between the packaging module and the chip is increased when the distance between the packaging module and the chip is increased, utilization of electric energy of an electronic device is reduced. In addition, there are lengthy wires between the packaging module and the chip. The lengthy wires result in an increase in size of an electronic device and increases a power distribution loss of the electronic device.

Figure 1C:
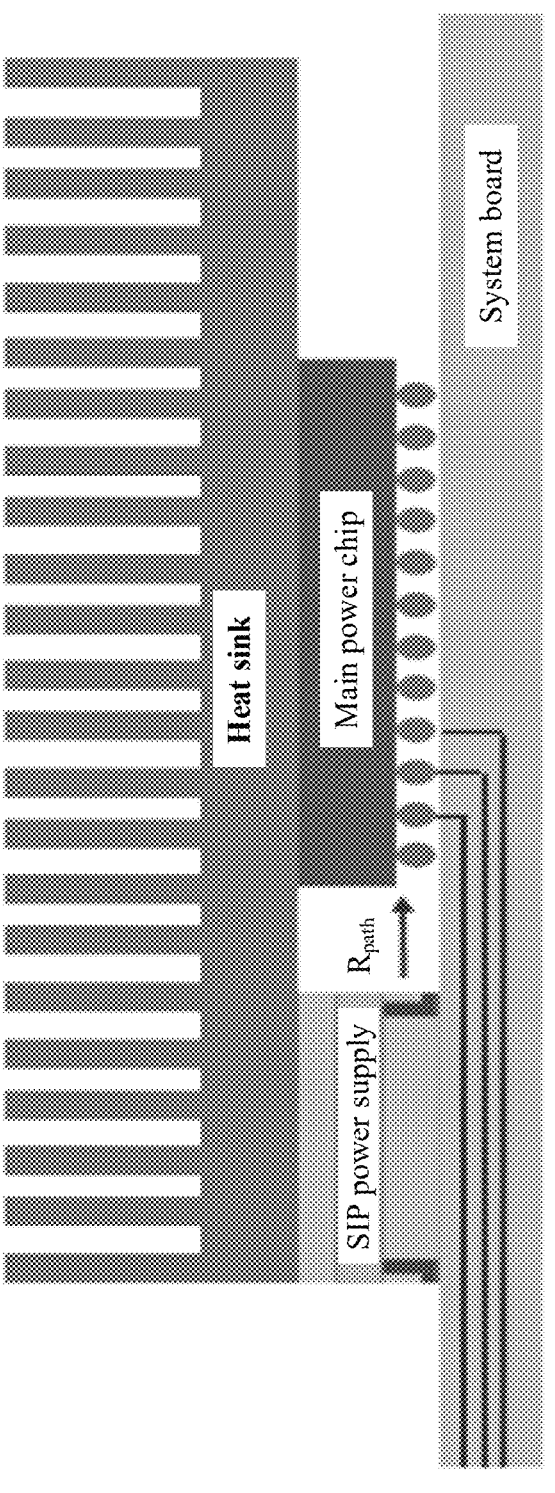
FIG. 1c is a schematic diagram of application of a packaging module according to an embodiment of this application.

FIG. 1c is a schematic diagram of application of a packaging module according to an embodiment of this application.

As shown in FIG. 1c, in view of the foregoing problem in the existing packaging module, an embodiment of this application provides a packaging module. Both a first surface and a second surface of a PCB in the packaging module are covered with a molding layer, a conductive pin is electrically connected to the PCB, the conductive pin is packaged inside the molding layer along a stacking direction of the PCB and the molding layer, and the conductive pin is partially exposed on an outer surface of the molding layer. When the packaging module supplies power to another element, the PCB outputs a current by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

In this embodiment of this application, a manner of outputting an electrical signal by the packaging module through the conducting pin may have other advantages. For example, an example in which the packaging module is a SIP power supply is used for description.

First, to meet a requirement for improving computing power of a chip in an electronic device, an area of the chip may be doubled when a size of a system board remains unchanged. In addition, a power supply capability of the SIP power supply may be improved compared with the last generation of products, and a size of the power supply may be reduced. If an existing solution of pin-out from a side wall is used, the power supply may be arranged at a position far from the chip. Because a copper loss Rpath on a wire is increased due to an increase in a distance, utilization of electric energy of the electronic device is reduced. However, the SIP power supply prepared by using a structure of the packaging module provided in this application may be arranged at a position close to the chip, and there are short wires between the packaging module and the chip. This reduces a size of an electronic device and reduces a power distribution loss of the electronic device.

In addition, to meet a requirement of a main power chip for dense wiring, the SIP power supply may be surface-mounted to the system board, and a height of the SIP power supply may be reduced as much as possible. In this way, the SIP power supply can share a heat sink with the chip, thereby reducing heat dissipation costs. If the existing solution of pin-out from the side wall is used, a size of the power supply is large because of a through hole reserved for pin-out from the side wall. In addition, a height of a pin in pin-out from the side cannot be reduced, and consequently the height of the power supply cannot be reduced. Therefore, a requirement for common heat dissipation cannot be met, and manufacturing costs are high. However, the SIP power supply prepared by using the structure of the packaging module provided in this application does not need to reserve a through hole, thereby reducing the size of the power supply. Because no pin needs to be inserted into the side wall, the height of the SIP power supply can be reduced, thereby meeting a size requirement for sharing the heat sink with the chip.

Then, in the existing solution of pin-out from the side wall, the pin may be inserted into the through hole and welded on the PCB. In this case, a manufacturing process, namely, a welding process, is added. In addition, the welding process is complex, and production costs are high. However, in the packaging module provided in this application, the conductive pin and a circuit element on the PCB are surface-mounted to or inserted into the PCB together in a same process. In this way, a manufacturing process is simple, and the process is simplified compared with the existing solution of pin-out from the side wall.

Figure 2:
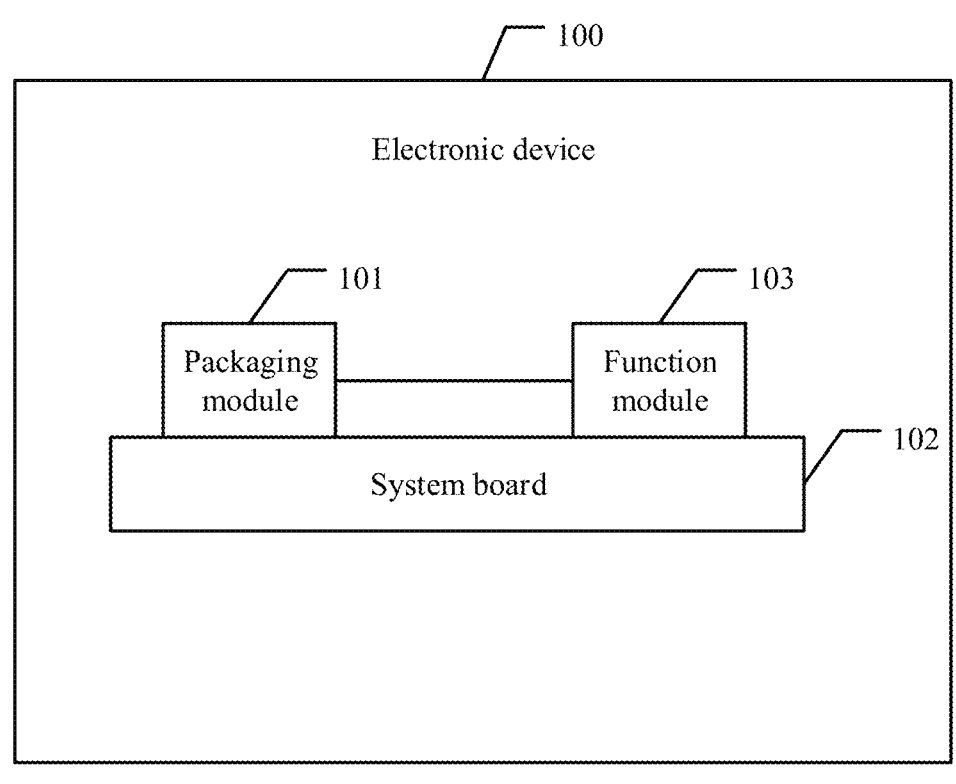
FIG. 2 is a schematic diagram of a structure of an electronic device according to an embodiment of this application.

FIG. 2 is a schematic diagram of a structure of an electronic device 100 according to an embodiment of this application.

As shown in FIG. 2, the electronic device 100 provided in this embodiment of this application includes a packaging module 101, a system board 102, and a function module 103.

The packaging module 101 and the function module 103 are surface-mounted to or inserted into the system board 102, and the packaging module 101 is connected to the function module 103.

The packaging module 101 may be a function module. An example in which the packaging module is a SIP power supply is used for description. The SIP power supply is a module that provides power to the electronic device. The SIP power supply provides electric energy required by all components in the electronic device. Whether a current and a voltage that are provided by the SIP power supply are stable directly affects working performance and a service life of the electronic device.

The function module 103 is a module that implements a function of the electronic device with the support of the packaging module 101. In some embodiments, the function module 103 may include a chip, the function module 103 may further include a heat dissipation plate, and the function module 103 may further include another element. This is not specifically limited herein.

The packaging module provided in this embodiment of this application is described based on the schematic diagram of the structure of the electronic device 100 shown in FIG. 2.

Figure 3:
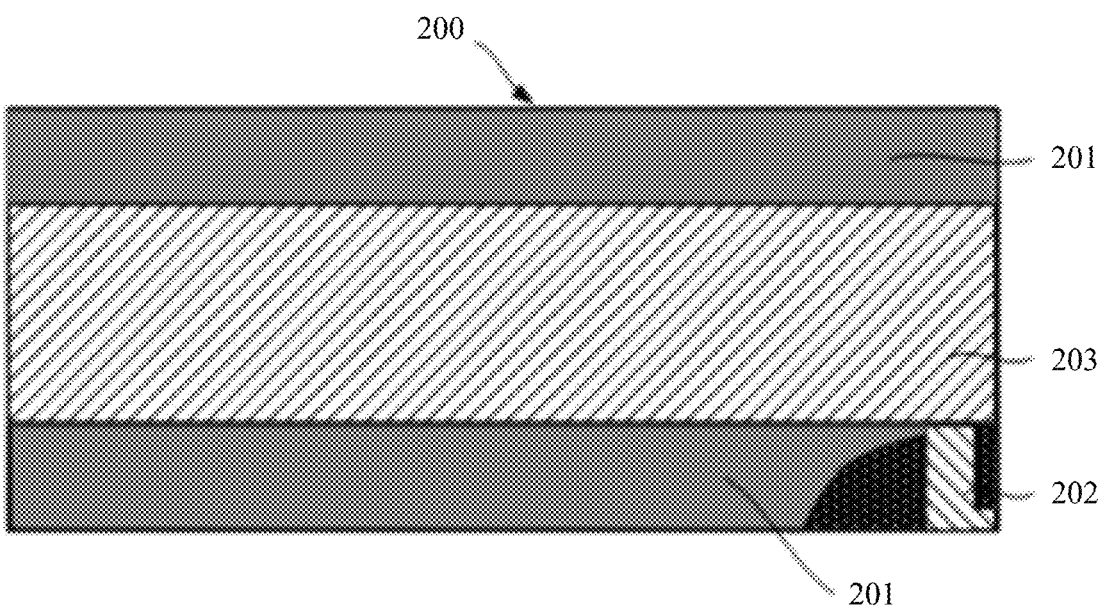
FIG. 3 is a schematic diagram of a structure of a packaging module according to an embodiment of this application.

FIG. 3 is a schematic diagram of a structure of a packaging module according to an embodiment of this application.

As shown in FIG. 3, this embodiment of this application provides the packaging module 200. The packaging module 200 includes a molding layer 201, a conductive pin 202, and a PCB 203.

Both a first surface and a second surface of the PCB 203 are covered with the molding layer 201.

The conductive pin 202 is electrically connected to the PCB 203, the conductive pin 202 is packaged inside the molding layer 201 along a stacking direction of the PCB 203 and the molding layer 201, and the conductive pin 202 is partially exposed on an outer surface of the molding layer.

When the packaging module 200 performs electrical interaction with another element, the PCB 203 outputs or inputs an electrical signal by using the conductive pin.

In this embodiment of this application, a plurality of circuit elements are integrated on the first surface and the second surface of the PCB. A circuit including the plurality of circuit elements may perform electrical interaction with another component in an electronic device by using the conductive pin. For example, the conductive pin is electrically connected to a circuit element integrated on the first surface or the second surface of the PCB, and the conductive pin is partially exposed outside an upper surface and a side surface of a molding surface. In this way, a part that is of the conductive pin and that is exposed outside the molding layer may be electrically connected to a system board or another element on a system board through soldering or the like. In this case, a circuit element integrated on the PCB may output or input an electrical signal by using the conductive pin, to implement electrical interaction with another component in the electronic device. For example, an example in which the packaging module is a SIP power supply is used for description. In the SIP power supply, the circuit element integrated on the PCB receives a control signal by using the conductive pin, or the circuit element integrated on the PCB outputs a current by using the conductive pin, so that the SIP power supply supplies power to another element in the electronic device.

In this embodiment of this application, in the packaging module, the outer surface of the molding layer is a surface that is of the molding layer and that is away from the PCB, the outer surface of the molding layer is a side surface of the molding layer, or the outer surface of the molding layer is a surface that is of the molding layer and that is away from the PCB and a side surface of the molding layer.

In this embodiment of this application, as shown in FIG. 3, the surface that is of the molding layer and that is away from the PCB is a surface that is of the molding layer and that is not in contact with the PCB, and a surface that is of the molding layer and that is close to the PCB is a surface that is in contact with the molding layer. As shown in FIG. 3, the side surface of the molding layer is a surface on a same plane as an exposed part of the PCB.

In this embodiment of this application, in a process of welding the packaging module to the system board, if the outer surface of the molding layer is the surface that is of the molding layer and that is away from the PCB, the packaging module may be surface-mounted to the system board through soldering or the like by using the conductive pin exposed on the surface that is of the molding layer and that is away from the PCB. In this way, assembly difficulty of the packaging module can be reduced, and the packaging module can implement heat dissipation through board mounting, thereby improving heat dissipation efficiency. If the outer surface of the molding layer is the side surface of the molding layer, the packaging module may be assembled on the system board through soldering or the like by using the conductive pin exposed on the surface that is of the molding layer and that is away from the PCB. This provides a new assembly manner. If the outer surface of the molding layer is the surface that is of the molding layer and that is away from the PCB and the side surface of the molding layer, the conductive pin exposed on the surface that is of the molding layer and that is away from the PCB and the side surface of the molding layer is assembled with the PCB through soldering or the like, and the conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

The packaging module provided in this embodiment of this application may be an SIP packaging module, or may be another type of packaging module. This is not specifically limited herein.

In this embodiment of this application, the molding layer 201 included in the packaging module may be made of bisphenol A epoxy resin, the molding layer may be made of phenolic epoxy resin, or the molding layer may be made of another type of epoxy resin and another type of organic matter that has a protection function and thermal conductivity and insulation properties. This is not specifically limited herein.

In this embodiment of this application, a material used for the conductive pin 202 included in the packaging module is a conducting material. The material used for the conductive pin 202 may be metal copper, the material used for the conductive pin 202 may be metal silver, or the material used for the conductive pin may be another metal material such as metal gold. Alternatively, the material used for the conductive pin may be a conducting material other than metal. This is not specifically limited herein.

In this embodiment of this application, the conductive pin may be surface-mounted to the PCB by using an SMT, or the conductive pin may be inserted into the PCB. This is not specifically limited herein.

In this embodiment of this application, a shape of the conductive pin may be an "L" shape shown in FIG. 3, or may be another shape. This is not specifically limited herein.

In this embodiment of this application, in some embodiments, the packaging module may include one conductive pin, or the packaging module may include a plurality of conductive pins. This is not specifically limited herein.

In this embodiment of this application, in some embodiments, the conductive pin in the packaging module may be electrically connected to the first surface of the PCB, the conductive pin in the packaging module may be electrically connected to the second surface of the PCB, or a plurality of conductive pins included in the packaging module may be electrically connected to the first surface of the PCB and a plurality of pins included in the packaging module are electrically connected to the second surface of the PCB. This is not specifically limited herein.

In this embodiment of this application, both the first surface and the second surface of the PCB in the packaging module are covered with the molding layer, the conductive pin is electrically connected to the PCB, the conductive pin is packaged inside the molding layer along the stacking direction of the PCB and the molding layer, and the conductive pin is partially exposed on the outer surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

FIG. 4 is a schematic diagram of a structure of a packaging module including a first conductive pin according to an embodiment of this application.

As shown in FIG. 4, in a possible embodiment, a molding layer includes a first molding layer and a second molding layer, and a conductive pin includes the first conductive pin.

A first surface of a PCB is covered with the first molding layer, and a second surface of the PCB is covered with the second molding layer.

A first end of the first conductive pin is electrically connected to the first surface of the PCB, the first conductive pin is packaged inside the first molding layer along a stacking direction of the first surface of the PCB and the first molding layer, and a second end of the first conductive pin is partially exposed on an outer surface of the first molding layer.

When the packaging module performs electrical interaction with another element, the PCB outputs or inputs an electrical signal by using the first conductive pin.

In this embodiment of this application, a plurality of circuit elements are integrated on the first surface of the PCB. A circuit including the plurality of circuit elements may output or input an electrical signal by using the first conductive pin, to perform electrical interaction with another element. The first end and the second end of the first conductive pin penetrate through the first molding layer, the first conductive pin is packaged inside the first molding layer along the stacking direction of the first surface of the PCB and the first molding layer, the first end of the first conductive pin is electrically connected to a circuit element integrated on the first surface of the PCB, and the second end of the first conductive pin is exposed on the outer surface of the first molding layer. In this way, a part that is of the first conductive pin and that is exposed outside the first molding layer may be electrically connected to a system board or another element on a system board through soldering or the like. In this case, a circuit element integrated on the PCB may output or input an electrical signal by using the first conductive pin, to implement electrical interaction with another component in an electronic device. For example, an example in which the packaging module is a SIP power supply is used for description. In the SIP power supply, the circuit element integrated on the PCB receives a control signal by using the first conductive pin, or the circuit element integrated on the PCB outputs a current by using the first conductive pin, so that the SIP power supply supplies power to another element in the electronic device.

In this embodiment of this application, the packaging module may include one first conductive pin, or the packaging module may include more than two first conductive pins. This is not specifically limited herein.

In this embodiment of this application, as shown in FIG. 4, a surface that is of the molding layer and that is away from the PCB is a surface that is of the molding layer and that is not in contact with the PCB, and a surface that is of the molding layer and that is close to the PCB is a surface that is in contact with the molding layer. As shown in FIG. 4, a side surface of the molding layer is a surface on a same plane as an exposed part of the PCB.

In this embodiment of this application, in a process of welding the packaging module to the system board, if the outer surface of the molding layer is the surface that is of the molding layer and that is away from the PCB, the packaging module may be surface-mounted to the system board through soldering or the like by using the first conductive pin exposed on the surface that is of the molding layer and that is away from the PCB. In this way, assembly difficulty of the packaging module can be reduced, and the packaging module can implement heat dissipation through board mounting, thereby improving heat dissipation efficiency. If the outer surface of the molding layer is the side surface of the molding layer, the packaging module may be assembled on the system board through soldering or the like by using the first conductive pin exposed on the surface that is of the molding layer and that is away from the PCB. This provides a new assembly manner. If the outer surface of the molding layer is the surface that is of the molding layer and that is away from the PCB and the side surface of the molding layer, the first conductive pin exposed on the surface that is of the molding layer and that is away from the PCB and the side surface of the molding layer is assembled with the PCB through soldering or the like, and the first conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

In this embodiment of this application, a type of the packaging module is similar to that in the embodiment shown in FIG. 3. Details are not described herein again.

In this embodiment of this application, a material type of the first molding layer and the second molding layer is similar to that of the molding layer described in the embodiment shown in FIG. 3. Details are not described herein again.

In this embodiment of this application, a material type and a shape of the first conductive pin are similar to those of the conductive pin described in the embodiment shown in FIG. 3. Details are not described herein again.

FIG. 5 is a schematic diagram of a structure of a packaging module including a plurality of first conductive pins according to an embodiment of this application.

As shown in FIG. 5, in a possible embodiment, a conductive pin further includes the plurality of first conductive pins.

The plurality of first conductive pins are disposed in a first molding layer, first ends of the plurality of first conductive pins are electrically connected to a first surface of a PCB, and second ends of the plurality of first conductive pins are exposed on an outer surface of the first molding layer.

In this embodiment of this application, when the packaging module performs electrical interaction with another element, the PCB outputs or inputs an electrical signal by using the plurality of first conductive pins.

A plurality of circuit elements are integrated on the first surface of the PCB. A circuit including the plurality of circuit elements may output or input an electrical signal by using the plurality of first conductive pins, to perform electrical interaction with another element. The first ends and the second ends of the plurality of first conductive pins penetrate through the first molding layer, the plurality of first conductive pins are packaged inside the first molding layer along a stacking direction of the first surface of the PCB and the first molding layer, the first ends of the plurality of first conductive pins are electrically connected to a circuit element integrated on the first surface of the PCB, and the second ends of the plurality of first conductive pins are exposed on the outer surface of the first molding layer. In this way, parts that are of the plurality of first conductive pins and a second conductive pin and that are exposed outside the first molding layer may be electrically connected to a system board or another element on a system board through soldering or the like. In this case, a circuit element integrated on the PCB may output or input an electrical signal by using the plurality of first conductive pins, to implement electrical interaction with another component in an electronic device. For example, an example in which the packaging module is a SIP power supply is used for description. In the SIP power supply, the circuit element integrated on the PCB receives a control signal by using the plurality of first conductive pins, or the circuit element integrated on the PCB outputs a current by using the plurality of first conductive pins, so that the SIP power supply supplies power to another element in the electronic device.

In this embodiment of this application, as shown in FIG. 5, a surface that is of the molding layer and that is away from the PCB is a surface that is of the molding layer and that is not in contact with the PCB, and a surface that is of the molding layer and that is close to the PCB is a surface that is in contact with the molding layer. As shown in FIG. 5, a side surface of the molding layer is a surface on a same plane as an exposed part of the PCB.

In this embodiment of this application, in a process of welding the packaging module to the system board, if the outer surface of the molding layer is the surface that is of the molding layer and that is away from the PCB, the packaging module may be surface-mounted to the system board through soldering or the like by using the plurality of first conductive pins exposed on the surface that is of the molding layer and that is away from the PCB. In this way, assembly difficulty of the packaging module can be reduced, and the packaging module can implement heat dissipation through board mounting, thereby improving heat dissipation efficiency. If the outer surface of the molding layer is the side surface of the molding layer, the packaging module may be assembled on the system board through soldering or the like by using the plurality of first conductive pins exposed on the surface that is of the molding layer and that is away from the PCB. This provides a new assembly manner. If the outer surface of the molding layer is the surface that is of the molding layer and that is away from the PCB and the side surface of the molding layer, the first conductive pins exposed on the surface that is of the molding layer and that is away from the PCB and the side surface of the molding layer are assembled with the PCB through soldering or the like, and the plurality of first conductive pins exposed on the surface that is of the molding layer and that is away from the PCB and the side surface of the molding layer all can form solder fillet. This arrangement manner can further increase a volume of a solder joint, improves stability of the solder joint, and prolongs a service life of the solder joint, thereby implementing more stable assembly between the packaging module and the PCB.

In this embodiment of this application, the plurality of first conductive pins may be arranged at an equal interval or unequal intervals along an outline of the packaging module. This is not specifically limited herein.

In this embodiment of this application, a type of the packaging module and a material type of the first molding layer and a second molding layer are similar to those in the embodiment shown in FIG. 4. This is not specifically limited herein.

In this embodiment of this application, a material type and a shape of the plurality of first conductive pins are similar to those of the first conductive pin described in the embodiment shown in FIG. 4. Details are not described herein again.

FIG. 6 is a schematic diagram of a structure of a packaging module including a first conductive pin and a second conductive pin according to an embodiment of this application.

As shown in FIG. 6, in a possible embodiment, a conductive pin further includes the second conductive pin.

A first end of the second conductive pin is electrically connected to a second surface of a PCB, the second conductive pin is packaged inside a second molding layer along a stacking direction of the second surface of the PCB and the second molding layer, and a second end of the second conductive pin is partially exposed on an outer surface of the second molding layer.

In this embodiment of this application, when the packaging module performs electrical interaction with another element, the PCB outputs or inputs an electrical signal by using the first conductive pin and the second conductive pin.

In this embodiment of this application, a plurality of circuit elements are integrated on a first surface of the PCB. A circuit including the plurality of circuit elements may output or input an electrical signal by using the first conductive pin and the second conductive pin, to perform electrical interaction with another element. A first end and a second end of the first conductive pin penetrate through a first molding layer, the first conductive pin is packaged inside the first molding layer along a stacking direction of the first surface of the PCB and the first molding layer, the first end of the first conductive pin is electrically connected to the circuit elements integrated on the first surface of the PCB, and the second end of the first conductive pin is exposed on an outer surface of the first molding layer. The first end and the second end of the second conductive pin penetrate through the second molding layer, the second conductive pin is packaged inside the second molding layer along the stacking direction of the second surface of the PCB and the second molding layer, the first end of the second conductive pin is electrically connected to a circuit element integrated on the second surface of the PCB, and the second end of the second conductive pin is exposed on the outer surface of the second molding layer. In this way, parts that are of the first conductive pin and the second conductive pin and that are exposed on the outer surfaces of the first molding layer and the second molding layer may be electrically connected to a system board or another element on a system board through soldering or the like. In this case, a circuit element integrated on the PCB may output or input an electrical signal by using the first conductive pin and the second conductive pin, to implement electrical interaction with another component in an electronic device. For example, an example in which the packaging module is a SIP power supply is used for description. In the SIP power supply, the circuit element integrated on the PCB receives a control signal by using the first conductive pin and the second conductive pin, or the circuit element integrated on the PCB outputs a current by using the first conductive pin and the second conductive pin, so that the SIP power supply supplies power to another element in the electronic device. In this embodiment of this application, the first surface of the PCB may include one or more first conductive pins, and the second surface of the PCB may include one or more second conductive pins. This is not specifically limited herein.

In this embodiment of this application, a plurality of second conductive pins may be arranged on an outline of the second surface of the PCB at an equal interval or unequal intervals, or may be arranged at another position on the second surface of the PCB at another equal interval or other unequal intervals. This is not specifically limited herein.

In this embodiment of this application, as shown in FIG. 6, a surface that is of the molding layer and that is away from the PCB is a surface that is of the molding layer and that is not in contact with the PCB, and a surface that is of the molding layer and that is close to the PCB is a surface that is in contact with the molding layer. As shown in FIG. 6, a side surface of the molding layer is a surface on a same plane as an exposed part of the PCB.

In this embodiment of this application, in a process of welding the packaging module to the system board, if the outer surface of the molding layer is the surface that is of the molding layer and that is away from the PCB, the packaging module may be surface-mounted to the system board through soldering or the like by using the first conductive pin exposed on the surface that is of the molding layer and that is away from the PCB. In this way, assembly difficulty of the packaging module can be reduced, and the packaging module can implement heat dissipation through board mounting, thereby improving heat dissipation efficiency. If the outer surface of the molding layer is the side surface of the molding layer, the packaging module may be assembled on the system board through soldering or the like by using the first conductive pin exposed on the surface that is of the molding layer and that is away from the PCB. This provides a new assembly manner. If the outer surface of the molding layer is the surface that is of the molding layer and that is away from the PCB and the side surface of the molding layer, the first conductive pin exposed on the surface that is of the molding layer and that is away from the PCB and the side surface of the molding layer is assembled with the PCB through soldering or the like, and the first conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

In this embodiment of this application, another circuit element in the electronic device including the packaging module may be surface-mounted to the packaging module by using the second conductive pin, thereby further making better use of space inside the electronic device.

In this embodiment of this application, the another circuit element may be surface-mounted to the packaging module by using the second conductive pin. If the outer surface of the molding layer is the surface that is of the molding layer and that is away from the PCB, the circuit element and the second conductive pin that is exposed on the surface that is of the molding layer and that is away from the PCB may be surface-mounted through soldering or the like. This arrangement manner of the outer surface can reduce difficulty of surface mounting between the circuit element and the packaging module. If the outer surface of the molding layer is the surface that is of the molding layer and that is away from the PCB and the side surface of the molding layer, the second conductive pin exposed on the surface that is of the molding layer and that is away from the PCB and the side surface of the molding layer and the circuit element are assembled through soldering or the like, and the second conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the circuit element.

In this embodiment of this application, a type of the packaging module and a material type of the first molding layer and the second molding layer are similar to those in the embodiment shown in FIG. 4. This is not specifically limited herein.

In this embodiment of this application, material types and shapes of the first conductive pin and the second conductive pin are similar to a material type and a shape of the first conductive pin described in the embodiment shown in FIG. 4. Details are not described herein again.

In some embodiments, the outer surface of the molding layer described in the foregoing embodiment may be the surface that is of the molding layer and that is away from the PCB. In some embodiments, the outer surface of the molding layer may be the side surface of the molding layer. In some embodiments, the outer surface of the molding layer is the surface that is of the molding layer and that is away from the PCB and the side surface of the molding layer. This is not specifically limited herein.

The foregoing embodiments provide different structures of a packaging module. The following embodiments provide a method for manufacturing a packaging module. The method for manufacturing a packaging module is described in detail in the following embodiments.

FIG. 7a and FIG. 7b are schematic diagrams of embodiments in which a circuit element and a conductive pin in a packaging module are prepared according to an embodiment of this application.

The circuit element and the conductive pin are prepared on a first surface and/or a second surface of a PCB.

As shown in FIG. 7a, in this embodiment of this application, an example in which the conductive pin is a U-shaped conductive pin is used for description. The U-shaped conductive pin is made of a metal material. The metal material may be a conducting material such as copper, aluminum, or an alloy thereof. This is not specifically limited herein. In addition, there is a solderable plating layer on the U-shaped conductive pin, and the plating layer may be made of tin Sn, silver Ag, gold Au, or the like. This is not specifically limited herein. A size of the U-shaped conductive pin may be adjusted according to a through-flow requirement, a heat dissipation requirement, or the like. This is not specifically limited herein.

First, a conductive pattern is etched on the first surface and/or the second surface of the PCB, and the conductive pattern is in a one-to-one correspondence with shapes of the circuit element and the U-shaped conductive pin that are to be subsequently surface-mounted or inserted. Then, a welding material is coated to the etched conductive pattern. The welding material may be tin, or the welding material may be another material. This is not specifically limited herein. Finally, the circuit element and the U-shaped conductive pin are welded on the PCB, and a height of the U-shaped conductive pin on the PCB may be higher than that of another circuit element. An auxiliary line is disposed on the PCB, the auxiliary line is used to indicate an actual outline of the PCB after cutting processing is performed on the PCB, and the auxiliary line coincides with the outline. As shown in FIG. 7a, a first end of the conductive pin is located inside the auxiliary line, and the first end of the U-shaped conductive pin is electrically connected to the circuit element in the PCB. FIG. 7b is a schematic diagram of a structure obtained after the circuit element and the conductive pin are surface-mounted to or inserted into the PCB. In some embodiments, the first end of the U-shaped conductive pin may be connected to a copper foil on a surface of the PCB, the first end of the U-shaped conductive pin may be connected to a copper foil inside the PCB, or the first end of the U-shaped conductive pin may be electrically connected to a circuit element in the PCB in another manner. This is not specifically limited herein. A second end of the U-shaped conductive pin is located outside the auxiliary wire, and an electrical signal inside the packaging module is output by using the second end.

In this embodiment of this application, the circuit element and the conductive pin are surface-mounted to the PCB by using a same process. Compared with an existing process for manufacturing a packaging module, there is no need to mount a pin on a side surface of a plastic package body after molding is performed on a circuit element, thereby simplifying an assembly process and reducing production costs of the packaging module.

Molding is performed on the entire PCB on which the circuit element and the conductive pin are integrated.

FIG. 8 is a schematic diagram of an embodiment of a process for preparing a molding layer in a packaging module according to an embodiment of this application.

As shown in FIG. 8, in this embodiment of this application, an injection molding manner is used for molding on an entire PCB on which a circuit element and a conductive pin are integrated, and a first surface and a second surface of the PCB and all circuit elements and conductive pins are placed in the molding layer to form a package form in which the PCB is located in the middle and there are an upper molding layer and a lower molding layer. In some embodiments, the molding layer may be made of bisphenol A epoxy resin, the molding layer may be made of phenolic epoxy resin, or the molding layer may be made of another type of epoxy resin and another type of organic matter that has a protection function and thermal conductivity and insulation properties. This is not specifically limited herein.

The packaging module obtained after molding is ground and thinned.

FIG. 9 is a schematic diagram of an embodiment of a process for polishing a packaging module according to an embodiment of this application.

As shown in FIG. 9, in this embodiment of this application, the packaging module formed after injection molding is polished by using a grinding tool such as a grinding disc or a grinding wheel. An excess molding material on a U-shaped conductive pin in a first molding layer obtained after injection molding is removed through grinding until a beam part of the U-shaped conductive pin is exposed.

In some embodiments, a U-shaped conductive pin may be integrated on a second surface of the PCB, or a lower surface of the packaging module may also be ground, and an excess molding material on a lower surface of a U-shaped conductive pin in a second molding layer obtained after injection molding is removed through grinding until a beam part of the U-shaped conductive pin is exposed.

The ground packaging module is cut.

FIG. 10a and FIG. 10b are schematic diagrams of an embodiment of a process for cutting a molding layer to obtain a packaging module according to an embodiment of this application.

As shown in FIG. 10a, in this embodiment of this application, a ground packaging module is cut based on an outline in a cutting manner such as wire cutting and numerical control machine cutting. During cutting, cutting is performed along an outline passing through a beam of a U-shaped conductive pin. After cutting, the packaging module with a pre-designed size is obtained, and an obtained L-shaped conductive pin is exposed on a surface and a side surface of the packaging module. As shown in FIG. 10b, a finished product formed after cutting is the packaging module shown in FIG. 10b.

In an embodiment of this application, a surface-mountable U-shaped conductive pin is provided, and a first end of the U-shaped conductive pin and a second end of the U-shaped conductive pin are respectively located on two sides of a cutting line. During surface mounting, the U-shaped conductive pin is surface-mounted to a PCB through surface mounting of the two ends of the U-shaped conductive pin, and the U-shaped conductive pin is more stable when being surface-mounted, thereby reducing assembling difficulty of the conductive pin. After grinding, a beam of the U-shaped conductive pin is exposed on a surface that is of a molding layer and that is away from the PCB. After cutting, a cross section that is formed after cutting and that is at the beam of the U-shaped conductive pin is exposed on a side surface of the molding layer. The conductive pin exposed on the surface that is of the molding layer and that is away from the PCB and the side surface of the molding layer can form solder fillet. This arrangement manner can further increase a volume of a solder joint, improves stability of the solder joint, and prolongs a service life of the solder joint, thereby implementing more stable assembly between the packaging module and the PCB.

An embodiment of this application provides a method for manufacturing a packaging module, including: mounting a circuit element and a conductive pin on at least one of a first surface and a second surface of a printed circuit board PCB, where the conductive pin is electrically connected to the PCB; performing molding on the PCB, the circuit element, and the conductive pin, where the conductive pin is packaged inside a molding layer along a stacking direction of the PCB and the molding layer; grinding a surface that is of the molding layer and that is away from the PCB, where the conductive pin in the ground molding layer is partially exposed on the surface that is of the molding layer and that is away from the PCB; and cutting the ground molding layer to obtain the packaging module, where the conductive pin in the packaging module is partially exposed on a side surface of the molding layer. When the packaging module performs electrical interaction with another element, the PCB outputs or inputs an electrical signal by using the conductive pin. In this way, there is no need to reserve a through hole on a packaging side of the packaging module, the packaging module may be arranged at a position close to a chip, and there are short wires between the packaging module and the chip. This reduces a size of an electronic device and reduces a power distribution loss of the electronic device.

The reset circuit provided in embodiments of this application is described in detail above. Specific examples are used in this specification to describe a principle and embodiments of this application. The descriptions in the foregoing embodiments are merely used to help understand the method and core ideas of this application. In addition, a person of ordinary skill in the art may make variations and modifications to this application in terms of the embodiments and application scopes based on the ideas of this application. Therefore, the content of this specification shall not be construed as a limitation to this application.

What is claimed is:

1. A packaging module comprising:
   a molding layer comprising a first molding layer and a second molding layer;
   a first conductive pin and a second conductive pin;
   a printed circuit board (PCB); and
   a circuit element,
   wherein a first surface of the PCB is covered with the first molding layer and a second surface of the PCB is covered with the second molding layer, the first surface and the second surface are disposed opposite to each other,
   wherein the circuit element is disposed on at least one of the first surface or the second surface of the PCB,
   wherein a first end of the first conductive pin is electrically connected to the first surface the PCB, the first conductive pin is packaged inside the first molding layer along a first stacking direction of the first surface of the PCB and the first molding layer, and a second end of the first conductive pin is partially exposed on a first outer surface of the first molding layer,
   wherein a first end of the second conductive pin is electrically connected to the second surface of the PCB, the second conductive pin is packaged inside the second molding layer along a second stacking direction of the second surface of the PCB and the second molding layer, and a second end of the second conductive pin is partially exposed on a second outer surface of the second molding layer, wherein the first outer surface of the first molding layer is a side surface of the first molding layer and the second outer surface of the second molding layer is a side surface of the second molding layer, the first outer surface and the second outer surface are on a same plane, and
   the first conductive pin is configured to output a first electrical signal from the second end of the first conductive pin that is partially exposed on the side surface of the first molding layer and the second conductive pin is configured to output a second electrical signal from the second end of the second conductive pin that is partially exposed on the side surface of the second molding layer to electrically interact with another system.

2. The packaging module according to claim 1, wherein the packaging module is a system in package SIP power supply.

3. The packaging module according to claim 1, wherein the first conductive pin is in an L shape.

4. An electronic device, comprising a packaging module, a system board, and a function module, wherein the packaging module supplies power to the function module, the packaging module and the function module are surface-mounted to, or inserted into, the system board, and
   wherein the packaging module comprises:
      a molding layer comprising a first molding layer and a second molding layer;
      a first conductive pin and a second conductive pin;
      a printed circuit board (PCB); and
      a circuit element,
      wherein a first surface of the PCB is covered with the first molding layer and a second surface of the PCB is covered with the second molding layer, the first surface and the second surface are disposed opposite to each other,
      wherein the circuit element is disposed on at least one of the first surface or the second surface of the PCB,
      wherein a first end of the first conductive pin is electrically connected to the first surface the PCB, the first conductive pin is packaged inside the first molding layer along a first stacking direction of the first surface of the PCB and the first molding layer, and a second end of the first conductive pin is partially exposed on a first outer surface of the first molding layer,
      wherein a first end of the second conductive pin is electrically connected to the second surface of the PCB, the second conductive pin is packaged inside the second molding layer along a second stacking direction of the second surface of the PCB and the second molding layer, and a second end of the second conductive pin is partially exposed on a second outer surface of the second molding layer,
      wherein the first outer surface of the first molding layer is a side surface of the first molding layer and the second outer surface of the second molding layer is a side surface of the second molding layer, the first outer surface and the second outer surface are on a same plane, or an outer surface of the molding layer is a surface of the molding layer that is away from the PCB and a side surface of the molding layer, and
      the first conductive pin is configured to output a first electrical signal from the second end of the first conductive pin that is partially exposed on the side surface of the first molding layer and the second conductive pin is configured to output a second electrical signal from the second end of the second conductive pin that is partially exposed on the side surface of the second molding layer to electrically interact with another system.

5. The electronic device according to claim 4, wherein the packaging module is a system in package SIP power supply.

6. The electronic device according to claim 4, wherein the first conductive pin is in an L shape.

7. A method for manufacturing a packaging module, comprising:

mounting a circuit element and a conductive pin on at least one of a first surface or a second surface of a printed circuit board (PCB), wherein the conductive pin is electrically connected to the PCB;

performing molding on the PCB, the circuit element, and the conductive pin, wherein the conductive pin is packaged inside a molding layer along a stacking direction of the PCB and the molding layer;

grinding a surface of the molding layer that is away from the PCB, wherein the conductive pin in the molding layer is partially exposed on the surface of the molding layer that is away from the PCB; and cutting the molding layer to obtain the packaging module, wherein:

the molding layer comprises a first molding layer and a second molding layer, and the conductive pin comprises a first conductive pin and a second conductive pin, the first surface of the PCB is covered with the first molding layer, and the second surface of the PCB is covered with the second molding layer, a first end of the first conductive pin is electrically connected to the first surface of the PCB, the first conductive pin is packaged inside the first molding layer along a first stacking direction of the first surface of the PCB and the first molding layer, and a second end of the first conductive pin is partially exposed on a first outer surface of the first molding layer, a first end of the second conductive pin is electrically connected to the second surface of the PCB, the second conductive pin is packaged inside the second molding layer along a second stacking direction of the second surface of the PCB and the second molding layer, and a second end of the second conductive pin is partially exposed on a second outer surface of the second molding layer, the first outer surface of the first molding layer is a side surface of the first molding layer and the second outer surface of the second molding layer is a side surface of the second molding layer, the first outer surface and the second outer surface are on a same plane, and wherein the second end of the first conductive pin and the second end of the second conductive pin are partially exposed on the side surface of the molding layer and configured to output a first electrical signal from the second end of the first conductive pin that is partially exposed on the side surface of the first molding layer and the second conductive pin is configured to output a second electrical signal from the second end of the second conductive pin that is partially exposed on the side surface of the second molding layer to electrically interact with another system.

8. The method for manufacturing the packaging module according to claim 7, wherein a same operation process is used for preparing the circuit element on the first surface and/or the second surface of the PCB and preparing the conductive pin on the first surface and/or the second surface of the PCB.

9. The method for manufacturing the packaging module according to claim 7, wherein the conductive pin is a U-shaped conductive pin, a first end and a second end of the U-shaped conductive pin are surface-mounted to, or inserted into, the PCB, and a beam of the U-shaped conductive pin is away from the PCB, wherein the grinding the surface of the molding layer that is away from the PCB comprises:

grinding the surface of the molding layer that is away from the PCB to a grinding line, wherein the grinding line is tangent to the beam of the U-shaped conductive pin; and after grinding, the beam of the U-shaped conductive pin is exposed on the surface of the molding layer that is away from the PCB, and wherein the cutting the molding layer comprises:

cutting the molding layer along a cutting line, wherein the first end of the U-shaped conductive pin and the second end of the U-shaped conductive pin are respectively located on two sides of the cutting line; and after cutting, a cross section that is formed after cutting and that is at the beam of the U-shaped conductive pin is exposed on the side surface of the molding layer.

* * * * *